United States Patent [19]

Iikbahar

[11] Patent Number: 5,528,166
[45] Date of Patent: Jun. 18, 1996

[54] PULSE CONTROLLED IMPEDANCE COMPENSATED OUTPUT BUFFER

[75] Inventor: Alper Iikbahar, Santa Cruz, Calif.

[73] Assignee: Intel Corporation, Santa Clara, Calif.

[21] Appl. No.: 403,410

[22] Filed: Mar. 14, 1995

[51] Int. Cl.⁶ ................................................. H03K 17/16
[52] U.S. Cl. ................................................. 326/27; 326/30
[58] Field of Search ............................ 326/9, 21, 27, 326/30

[56] References Cited

U.S. PATENT DOCUMENTS

| | | |
|---|---|---|
| 3,854,057 | 12/1974 | Williams et al. . |
| 3,970,875 | 7/1976 | Leehan . |
| 4,567,385 | 1/1986 | Falater et al. . |
| 4,719,369 | 1/1988 | Asano et al. ............................ 326/30 |
| 4,839,537 | 6/1989 | Ueno . |
| 4,855,623 | 8/1989 | Flaherty . |
| 4,877,978 | 10/1989 | Platt . |
| 4,948,991 | 8/1990 | Schucker et al. .................. 326/30 X |
| 4,975,598 | 12/1990 | Borkar . |
| 5,015,880 | 5/1991 | Drake et al. ............................ 326/27 |
| 5,036,232 | 7/1991 | Jungert et al. ........................ 326/21 X |
| 5,039,874 | 8/1991 | Anderson . |
| 5,059,830 | 10/1991 | Tokumaru et al. . |
| 5,063,308 | 11/1991 | Borkar . |
| 5,095,231 | 3/1992 | Sartori et al. ............................ 326/30 |
| 5,107,230 | 4/1992 | King . |
| 5,134,311 | 7/1992 | Biber et al. . |
| 5,153,457 | 10/1992 | Martin et al. ........................ 326/27 X |
| 5,162,672 | 11/1992 | McMahan et al. . |
| 5,166,555 | 11/1992 | Kano ....................................... 326/27 |
| 5,294,845 | 3/1994 | McMahan et al. . |

*Primary Examiner*—David R. Hudspeth
*Attorney, Agent, or Firm*—Blakely, Sokoloff, Taylor & Zafman

[57] ABSTRACT

An improved buffer circuit, particularly a pulse controlled impedance compensated output buffer. The improvement includes two drivers which are activated during a portion of the switching time of the output. The two drivers are activated for different durations which partially encompass the output transition and may be overlapping. A feedback circuit may also be used, providing further impedance compensation. By the feedback circuit actuating a driver in response to a difference between a reference signal level and an output signal level, the total output drive strength of the buffer is better tailored to the load impedance. The reference signal level may be sampled at a point during the output transition.

29 Claims, 7 Drawing Sheets

PULSE CONTROLLED IMPEDANCE COMPENSATED OUTPUT BUFFER

FIELD OF THE INVENTION

The present invention pertains to the field of integrated circuits and specifically, implementations of buffers for integrated circuits.

BACKGROUND

Buffers on integrated circuits often drive external loads which are large relative to the internal loads other circuits drive. As technological developments continually bolster the operating frequencies of integrated circuits, the external loads, which usually include circuit board traces and other integrated circuits, are driven faster and faster to comply with tighter timing specifications. Higher slew rates emphasize impedance mismatches since both capacitive and inductive components of transmission line impedance become more pronounced with increased frequency.

Buffers often operate across a wide variety of operating conditions and often comprise transistors with device characteristics which vary according to the circuit fabrication process. As an example, both temperature and voltage are operating conditions which affect a typical CMOS device. A higher device temperature or a lower voltage power supply will reduce device switching speeds (effectively increasing buffer impedance). Fabrication processes are often continuously refined to produce faster devices and obtain better performance. Fabrication of a CMOS device with a shorter channel length or a thinner gate oxide will typically increase switching speeds (effectively decreasing impedance). Device characteristics are also subject to limited deviations in the manufacturing process. Thus, minor processing refinements or manufacturing deviations can also shift the impedance of a buffer from its original design target.

Additionally, an impedance mismatch may be caused by external loads. An integrated circuit is often used in a variety of system configurations each possibly providing a different external load on a particular signal. In each particular system, output signals with distinct purposes generally have distinct signal routing to the appropriate load devices. Consequently, external loads differ from signal to signal and from system to system, further increasing the variation in performance of uncompensated buffers.

An uncompensated buffer may not operate well under extreme conditions. Under the conditions when the buffer's impedance is high, it may not switch fast enough. Under the opposite low impedance conditions, it may also fail because it switches too fast.

Thus the expected deviations in impedance in uncompensated output circuits are a problem. Transmission line effects including ringing and reflection become more pronounced as switching frequencies increase. Further, processing changes and external load variation compound impedance matching problems of an uncompensated output circuit, making it desirable to develop a buffer which is impedance compensated.

As a result a number of compensation schemes have evolved. Generally, the designer still has a target impedance range, but various techniques adjust the buffer's operation before or during operation to help minimize impedance mismatch problems. Prior art techniques have included using any of a number of parallel buffers according to either a user's selection or the results of an impedance test initiated by the chip. Similarly, operating conditions and processing have been compensated by adjusting output driver's effective size according to the current flow through a sampled transistor (U.S. Pat. No. 4,719,369).

Another prior art compensated output buffer scheme as illustrated in FIG. 1 is redrawn from FIG. 2 of U.S. Pat. No. 4,975,598. Bias voltages NCOMP and PCOMP, which are developed by monitoring scaled down versions of the output buffer, bias transistors in a predriver stage of buffers 120a–e. The bias voltages adjust output waveforms of a predriver circuit, thereby compensating a main driver. As indicated by N Type MOS Transistor Compensator block 100 and P Type MOS Transistor Compensator 110, this method requires two scaled down versions of the output buffer to develop the compensation voltages.

In another prior art reference, U.S. Pat. No. 5,063,308 "Output Driver with Static and Transient Parts," a buffer with a driver continuously enabled and a driver enabled during an output transition has been discussed in the context of reducing the switching noise generated during the output transition. This patent discusses using a schmitt trigger circuit to turn off a transient portion of a buffer, resulting in less ground bounce due to the reduced instantaneous switching current.

Thus, the known prior art reveals a number of impedance compensation techniques and also reveals a buffer with static and transient drivers.

SUMMARY OF THE DISCLOSURE

The present disclosure describes an improved buffer circuit, particularly a pulse controlled impedance compensated output buffer. The buffer includes two transient drivers which are activated during a portion of the switching time of the output. The two transient drivers are activated for different durations which partially encompass the output transition and which may be overlapping. Operating conditions which cause increased device speeds shorten the duration stronger driver transistors are active. Conversely, slower device speeds increase the duration weaker driver transistors are active. Thus, the counteracting driving durations and device strengths result in a compensated time average effective impedance.

A feedback circuit which provides impedance compensation by adjusting a total buffer circuit drive strength may be included. By actuating a driver in response to a difference between a reference signal level and an output signal level, the total output drive strength of the buffer is better tailored to the load impedance. The reference signal level may be sampled at a point during the output transition.

These and other features, aspects, and advantages of the present invention will become better understood with regard to the following description, appended claims, and accompanying drawings.

BRIEF DESCRIPTION OF THE FIGURES

The present invention is illustrated by way of example and not limitation in the figures of the accompanying drawings.

DETAILED DESCRIPTION

An impedance compensated buffer is described. In the following description, numerous specific details are set forth, such as device technologies, fabrication processes, and signaling nomenclature, in order to provide a thorough understanding of an embodiment of the present invention. For example, one embodiment of this invention is implemented using CMOS technology with N channel field effect transistors (referred to as N transistors or pulldowns) and P channel field effect transistors (P transistors or pullups). Additionally, voltage levels of a power supply voltage (Vcc) and ground (Vss) are used to represent a logical 1 (high) and 0 (low). It will be apparent to those skilled in the art that the present invention may be practiced without these specific details.

Figure 1:
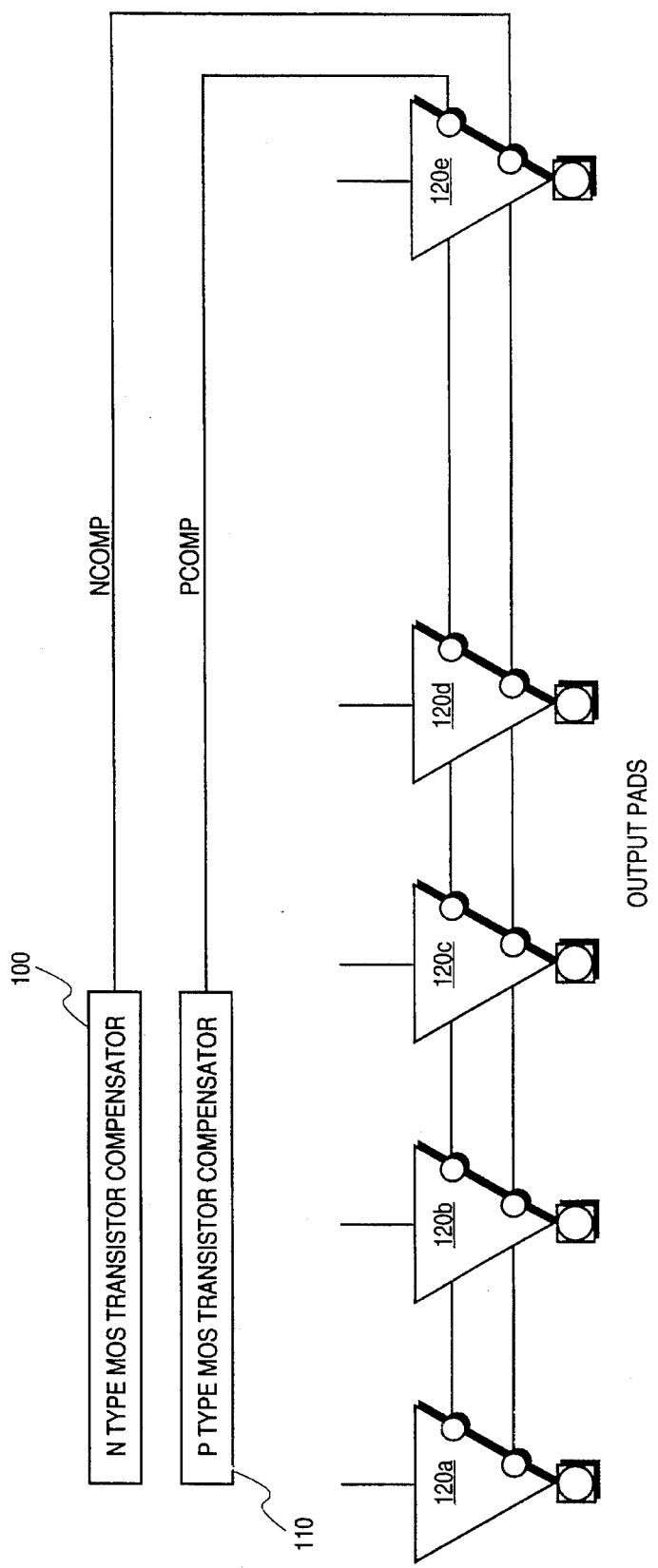
FIG. 1 is a block diagram showing a prior art compensated output buffer.
Figure 2:
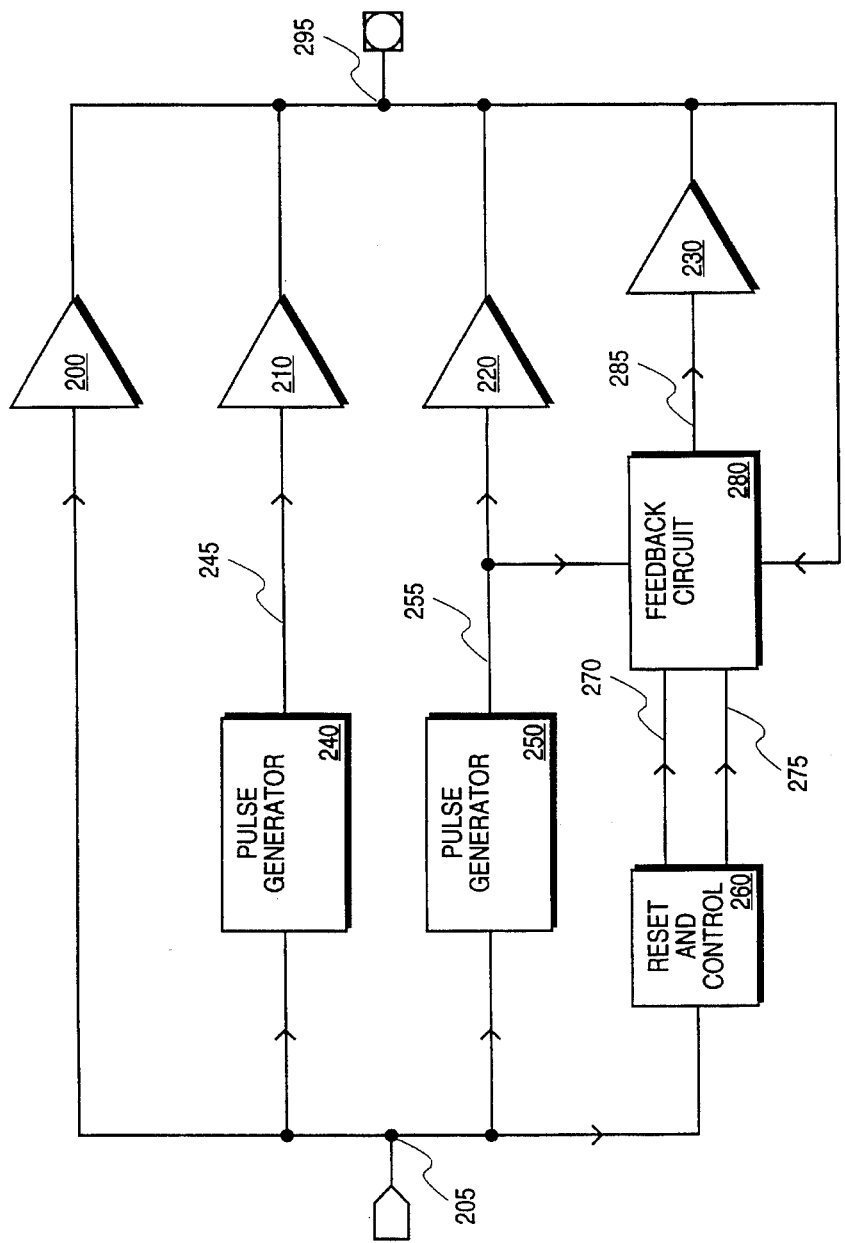
FIG. 2 is a block diagram showing an embodiment of the present invention.

An embodiment of a buffering circuit of the present invention as shown in FIG. 2 comprises several functional blocks. This circuit is particularly suited for use in a computer system where an external load will be coupled to output 295 such as a data line or an address line. Uncompensated buffer 200, pulsed or transient buffers 210 and 220, and feedback buffer 230 can all drive output 295, providing an output transition on output 295 in response to an input transition on input 205. Pulsed buffers 210 and 220 provide a drive capacity compensated for changes in operating conditions or device characteristics. Generally, this compensation is achieved by enabling pulsed buffers 210 and 220 for shorter durations under low impedance conditions and for longer durations under high impedance conditions. Pulse generators 240 and 250 produce appropriate control signals on control buses 245 and 255 which enable pulsed buffers 210 and 220 respectively.

Feedback buffer 230 drives output 295 according to the control information generated on control bus 285 of feedback buffer 230. Feedback circuit 280 adapts the buffering circuit to the output impedance of external loads by enabling feedback buffer 230 to suppress excessive ringing on output 295. Feedback circuit 280 samples a reference value on a feedback input coupled to output 295 during a pulse produced by pulse generator 250. Feedback circuit 280 then actuates feedback buffer 230 responsive to the difference between a signal level of output 295 and the reference value. To prepare the feedback circuit 280 for each output transition, reset and control logic 260 generates control signals on reset bus 270 and control bus 275 of feedback circuit 280 in response to each input transition.

While pulsed buffers 210 and 220 and feedback buffer 230 may be selectively enabled during a transition on output 295, uncompensated buffer 200 drives values on output 295 on a continuous basis. Uncompensated buffer 200 does assist in switching output 295 but has the primary purpose of maintaining the proper value on output 295 when the other buffers are not enabled.

In the embodiment of FIG. 2, the output 295 is inverted with respect to input 205. Uncompensated buffer circuits, both inverting and non-inverting are well known in the art, and as previously described in the Background section, uncompensated buffer circuits may exhibit impedance changes. Design of an uncompensated buffer circuit typically requires matching the final driver to a particular load; however, different design considerations apply for uncompensated buffer 200 of FIG. 2 due to the peculiar role the uncompensated buffer 200 plays in the switching of output 295. Instead of being the primary driver of the output transition, uncompensated buffer 200 is needed to maintain a DC voltage level on the output 295 by suppressing voltage reflections and other sources of noise. Generally, the larger the uncompensated buffer 200, the better the noise suppression; however, as previously discussed in the Background section, the variations in performance of large uncompensated buffers due to changing operating conditions may be undesirable. Thus, uncompensated buffer 200 should be made only large enough to suppress expected noise on output 295. Additional design considerations will be discussed in considering the parallel operation of the various functional blocks of FIG. 2.

Figure 3:
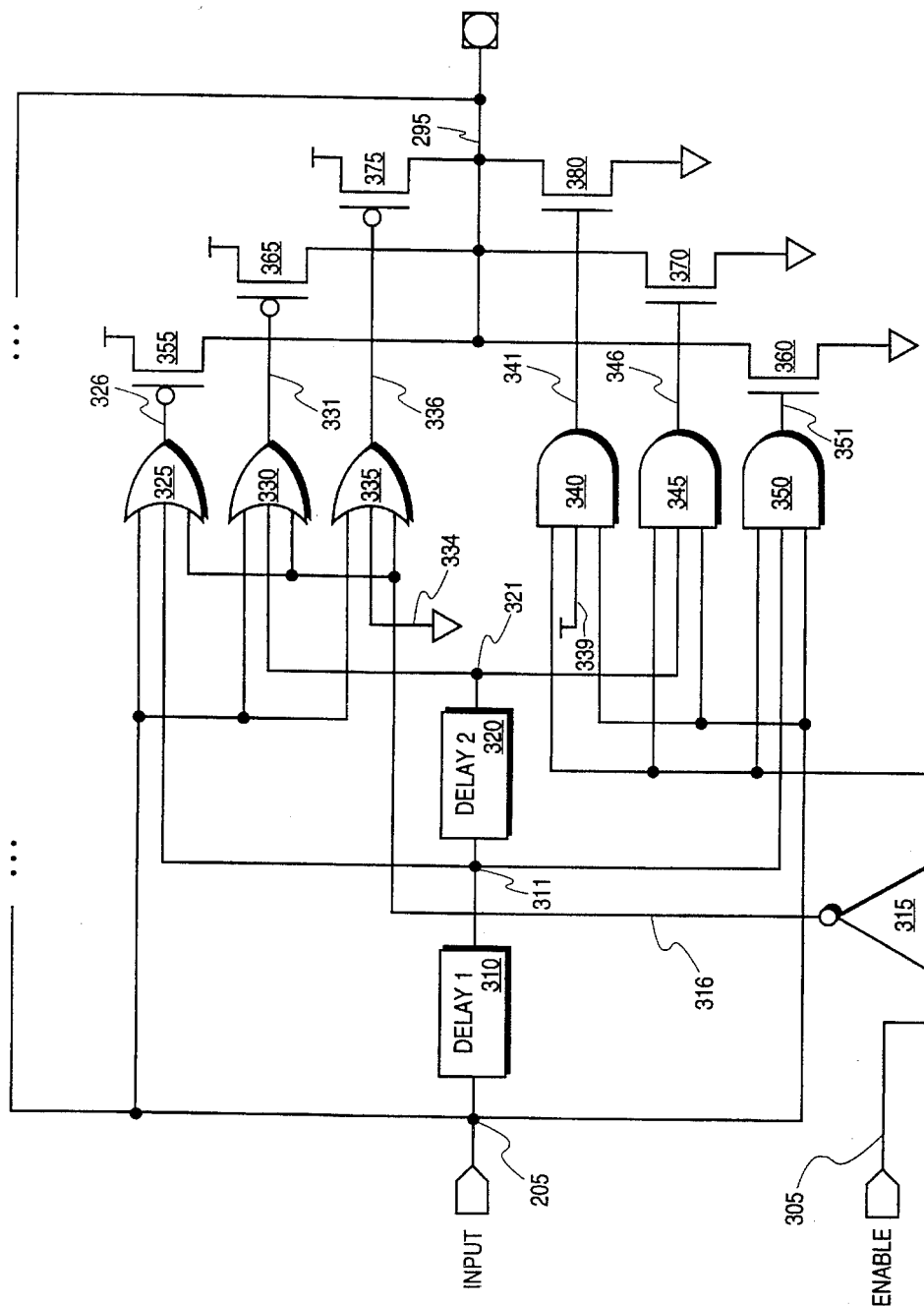
FIG. 3 is a schematic representation of part of the embodiment of FIG. 2.

While there are many possible implementations of an uncompensated buffer circuit, one embodiment may be found in FIG. 3. An inverting buffer suited to function as uncompensated buffer 200 comprises OR gate 335, AND gate 340, driver transistor 375, and driver transistor 380. As a predriver for driver transistor 375, OR gate 335 is typically implemented using a NOR gate and an inverter. OR gate 335 has an output coupled to node 336 and a first, second, and third input coupled respectively to input 205, a Vss connection 324, and an inverted enable signal 316. The inverted enable line 316 is connected to an output of inverter 315, inverter 315 also being connected to enable line 305. AND gate 340 has an output coupled to node 341 and a first, second, and third input coupled respectively to enable signal 305, Vcc connection 339, and input 205.

Vss connection 334 and Vcc connection 339 do not provide any additional logical functions, but do allow predriver delay matching. Generally, the propagation delay from a first input of a logic gate to the output can be different than the propagation delay from a second or third input of that logic gate to the output. Similarly, the delay through a two input logic gate can differ from the delay through a three input logic gate. This is best illustrated considering the fact that logic gates include series transistors, and the activation of a transistor closer to the output node generally switches the output faster than the activation of a transistor further from the output node. Thus the particular input connection and the number of inputs can affect propagation delay, and duplicating logic gates and the connections of certain inputs can be advantageous in matching delays. In FIG. 3, the delay from input 205 through OR gate 335 is better matched to that from input through OR gate 330 since they both are three input OR gates and the same input lead is connected to the input 205. Logically correct operation, however, requires Vss connection 334.

An alternate embodiment could improve the propagation delay from input 205 to output 295 by using a non-inverting buffering scheme. The predriver logic could be rearranged using a NAND gate in place of OR gate 335 (since NAND gates typically have one less stage than OR gates) with the use of enable line 305 instead of the inverted enable line 316 and a connection to Vcc instead of the Vss connection 334.

Substitutions for the other OR gates 325 and 330 should be made in a similar manner, and the AND gates 340, 345, and 350 should be replaced with NOR gates (with analogous input polarity changes) if the smaller input 205 to output 295 delay is desired. Other possible logical rearrangements are possible and within the scope of the present invention.

The driver transistors of the particular embodiment of an uncompensated buffer as illustrated in FIG. 3 are P driver transistor 375 and N driver transistor 380. Driver transistor 375 has a source coupled to Vcc, a drain coupled to output 295 and a gate coupled to node 326. Driver transistor 380 has a source coupled to Vss, a drain coupled to output 295, and a gate coupled to node 341. When enable line 305 is held low, driver transistor 375 and driver transistor 380 am prevented from driving; however, during normal operation, the enable line 305 is held high and driver transistor 375 will be turned on in response to a low value on input 205. Correspondingly, driver transistor 380 will be turned on in response to a high value on input 205. It will be appreciated by one skilled in the art that inputs and outputs of either active high or low polarity as well as various logical permutations may be used for the disclosed driver and predriver circuits. Further, it will be appreciated by one skilled in the art that various gates, delays, or other devices may be used to appropriately couple circuit elements as described.

Referring back to FIG. 2, pulsed buffer 220 also drives output 295. Pulse generator 250, being coupled to input 205 and control bus 255, controls a first duration during which pulsed buffer 220 is enabled. Control bus 255 may include any combination of control signals by which pulsed buffer 220 may be enabled for the first duration. For example, an input signal with a value reflective of input 205 and a pulsed enable signal may be used. Alternately, a pulsed driver signal may be used for each of two driver transistors which may be used in pulsed buffer 220.

The block diagram of FIG. 2 illustrates pulse generator 250 and pulsed buffer 220 (and similarly with pulse generator 240 and pulsed buffer 210) as separate blocks; however, a schematic implementation may involve circuitry which is not so clearly separated. FIG. 3 shows one circuit implementation of pulsed buffer 220 and pulse generator 250. Pulse generator 250 is formed by delay 310, OR gate 325, AND gate 350, and driver transistors 355 and 360. Delay 310 is an inverting delay with an input connected to input 205 and an output connected to node 311. Delay 310 is typically formed using a string of inverters, and according to the implementation of FIG. 3, an odd number of inverters should be used.

OR gate 325 has an output coupled to node 326 and a first, second, and third input respectively coupled to input 205, node 311, and inverted enable line 316. Driver transistor 355 is a P transistor with a source coupled to Vcc, a drain coupled to output 295, and a gate coupled to node 326. AND gate 350 has an output coupled to node 351, and a first, second, and third input coupled respectively to enable line 305, node 311, and input 205. Driver transistor 360 is an N transistor with a source coupled to Vss, a drain coupled to output 295, and a gate coupled to node 351.

The circuit of FIG. 3 thus described enables pulse controlled operation of driver transistors 355 and 360. From the following description of the circuit operation in response to a transition on input 205 from a 0 to a 1, one skilled in the art will appreciate the analogous operation occurring with a 1 to 0 transition. Initially, enable line 305 is 1, input 205 is 0, and node 311 is 1 since delay 310 has an odd number of inverters. Node 351 is thus driven to a 0 by AND gate 350. When input 205 switches to a 1, AND gate 350 will drive an active high pulse on node 351 until the input transition from input 205 propagates through delay 310 and a 0 reaches AND gate 350. This active high pulse turns on the driver transistor 360, thus driving output 295 for a pulse duration which is dependent on delay 310. Since AND gate 340 and AND gate 350 receive the same input transition, both begin switching at approximately the same time. Delay 310 will generally comprise a number of inverters such that the pulse on node 351 will at least partially encompass the output transition. When driver transistor 380 turns on in response to the input transition, it remains on throughout the remainder of the transition and maintains the logic value when other buffers have switched off.

So far described in FIG. 3 is a pulsed driver which is active for a pulse duration partially encompassing a particular output transition and a driver which is active throughout the particular output transition. The desired impedance compensation is achieved when a time averaged impedance is considered. The counteracting pulse duration and device strength result in reduced change in net driving capacity through a transition. Consider a processing or environmental condition (as discussed in Background) which causes all devices to vary from "typical" to "fast". A fast condition is really the result of each driver having increased drive strength. The net result is that the duration associated with delay 310 is shorter than typical and the drive strength of driver transistor 360 is greater than typical; thus the driver transistor 360 is stronger, but is on for a shorter duration, resulting in an impedance that is compensated when considered over the duration of the output transition.

Since the buffering circuit of FIG. 2 contains both compensated and uncompensated buffers, properly tuning the amount of the compensation provided by pulsed buffers 210 and 220 can improve the overall buffer circuit performance. As described below, this can be accomplished through proper design of delay 310 and delay 320. Depending on the relative sizes of the compensated and uncompensated portions of the buffering circuit, it may be desirable to slightly overcompensate the pulsed buffers 210 and 220 to counteract the effect of the uncompensated buffer 200. This can be accomplished by increasing or decreasing the sensitivity of pulse generators 240 and 250 to processing or environmental conditions.

Delay 310 and delay 320 control the width of pulses generated in the circuit shown in FIG. 3. The inverters of delay 310 and delay 320 are specially designed according to the desired amount of pulse width variation. For maximum pulse width variation an inverter with the minimal channel length allowed for a given process should be used since smaller channel length devices are typically more sensitive to processing changes. For a buffering circuit in which less compensation is required, it may be desirable to tune the delay line with channel lengths or other sizing characteristics based on those of the final drivers.

Unfortunately, using one pulsed buffer and one uncompensated buffer only provides two possible drive impedances, making smooth output transitions with a significantly compensated impedance difficult to achieve. Either the pulsed buffer is too strong such that when it shuts off, the uncompensated buffer is too weak to complete the transition suitably, or the uncompensated buffer is made so big that the impedance cannot be sufficiently compensated. The present invention solves this problem using an operative balance of circuit complexity and desired compensation with two pulsed buffers. Alternately, more than two drivers and pulse generators could be used to gradually turn off stages allowing a smooth output transition and a high degree of impedance compensation.

Thus, as seen in FIG. 2, a second pulse generator 240 and pulsed buffer 210 are used. Pulse generator 240 has an output coupled to control bus 245 and an input coupled to input 205. Pulsed buffer 210 is coupled to control bus 245 and output 295.

The embodiment of FIG. 3 also includes a circuit implementation of a second pulsed buffer comprising elements delay 310, delay 320, OR gate 330, AND gate 345, and driver transistors 365 and 370. Delay 320 is a noninverting delay which typically comprises an even number of inverters. Its input is coupled to node 311 and output coupled to node 321. OR gate 330 has an output coupled to node 331 and a first, second, and third input respectively coupled to input 205, node 321, and inverted enable line 316. Driver transistor 365 is a P transistor with a source coupled to Vcc, a drain coupled to output 295 and a gate coupled to node 331. AND gate 345 has an output coupled to node 346 and a first, second, and third input respectively coupled to enable line 305, node 321, and input 205. Driver transistor 370 is an N transistor with a source coupled to Vss, a drain coupled to output 295, and a gate coupled to node 346.

The second pulsed buffer of FIG. 3 functions similarly to the first pulsed buffer as previously described with respect to FIG. 3, except for the fact that a second delay, delay 320, is added in series to the first delay 310 such that driver transistor 370 will be active for a second duration longer than the first duration during which driver transistor 360 was enabled. Two alternate implementations of the circuit of FIG. 3 include delaying input 205 to one of the pulsed buffers or the uncompensated buffer to reduce simultaneous switching, or using more delays and more buffers for improved compensation or smoother output transitions.

Figure 4A:
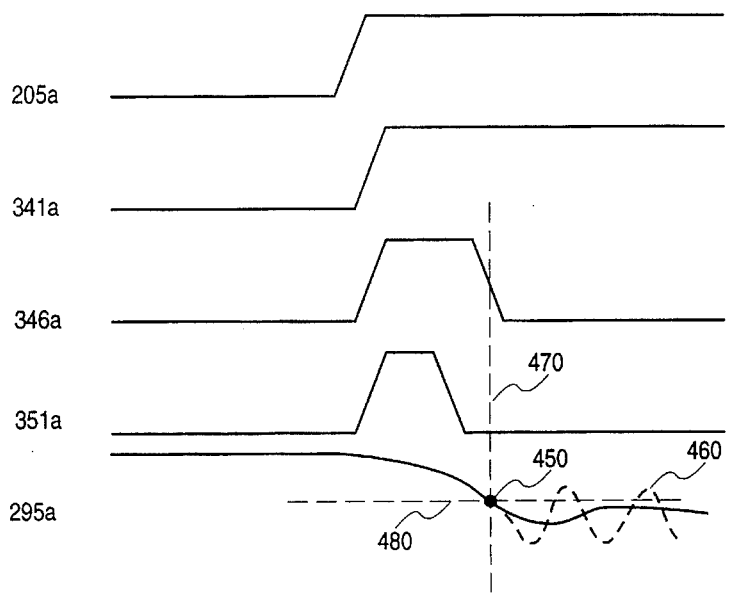
FIG. 4A is a timing diagram showing waveforms from the circuit of FIG. 3 operating in response to an input transition from low to high.
Figure 4B:
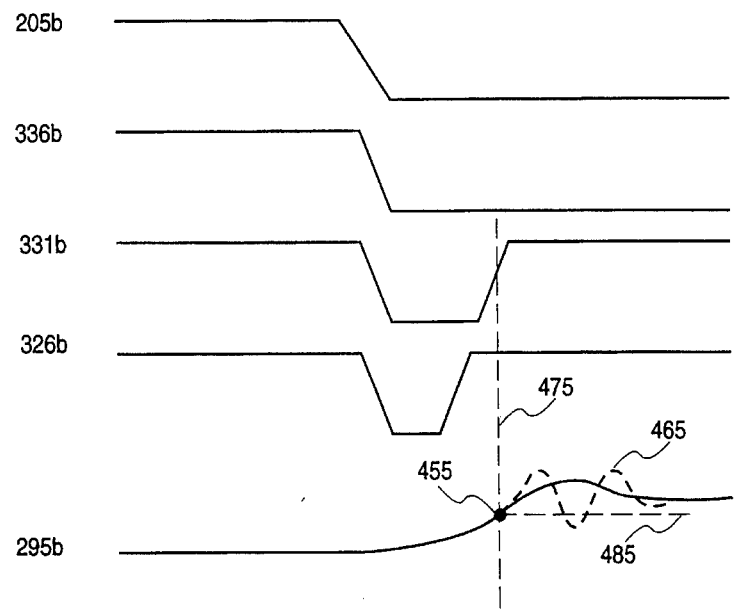
FIG. 4B is a timing diagram showing waveforms from the circuit of FIG. 3 operating in response to an input transition from high to low.

Various waveforms illustrating the operation of the circuit of FIG. 3 are shown in FIG. 4A and FIG. 4B. FIG. 4A shows voltages that occur on input 205, node 341, node 346, node 351, and output 295 during a transition of input 205 from a 0 to a 1 as shown by waveform 205a. Waveform 341a shows the voltage on node 341, demonstrating that driver transistor 380 is turned on and kept on to maintain the logic value 0 on output 295. Since AND gate 345 is coupled to the output of delay 320, a first pulse is developed on node 346 as illustrated by waveform 346a. Waveform 351a shows the voltage on node 351 which includes a second pulse shorter than that on node 346 since delay 310 is necessarily shorter than the combination of delay 310 and delay 320. The driver transistors 370 and 360 assist driver transistor 380 in switching output 295 during the high time of waveforms 346a and 351a, respectively. As previously discussed, a compensated time averaged impedance is achieved as operating conditions vary the width of the first and second pulses counteracting changes in driver transistor strengths.

Similarly, FIG. 4B shows voltages that occur on input 205, node 336, node 331, node 326, and output 295 during a transition on input 205 from a 1 to a 0. Waveform 205b shows the input transition. Waveform 336b shows the voltage on node 336, demonstrating that driver transistor 375 is turned on and kept on to maintain the logic value 1 on output 295. Since OR gate 330 is coupled to the output of delay 320, a first pulse is developed on node 331 as illustrated by waveform 331b. Waveform 326b shows the voltage on node 326 which includes a second pulse shorter than that on node 331 since delay 310 is necessarily shorter than the combination of delay 310 and delay 320. The driver transistors 365 and 355 assist driver transistor 375 in switching output 295 during the low time of waveforms 331b and 326b respectively. This complementary operation achieves the same compensated time averaged impedance as previously described with respect to FIG. 4A.

Thus, using two pulsed buffers with a conventional buffer produces an output impedance sufficiently matched for a particular configuration, and the embodiment of FIG. 3, or one with more numerous pulsed buffers, serves as an effective output buffer.

If further compensation is necessary due to unacceptable levels of output ringing or reflection, a feedback circuit 280 and feedback buffer 230 illustrated in FIG. 2 may be used in conjunction with the circuitry of FIG. 3. The feedback circuit 280 actuates feedback buffer 230 responsive to a difference between a signal level on output 295 and a reference value, thereby reducing the impedance mismatch that caused the output distortion. Feedback circuit 280 has an output coupled to control bus 285, and inputs coupled to reset bus 270, control bus 275, node 255, and output 295. A reset and control circuit 260 is coupled to input 205 and generates control signals on reset bus 270 and control bus 275. In the present embodiment, reset bus 270 comprises a first and a second reset signal, and control bus 275 comprises an enable signal.

Figure 5:
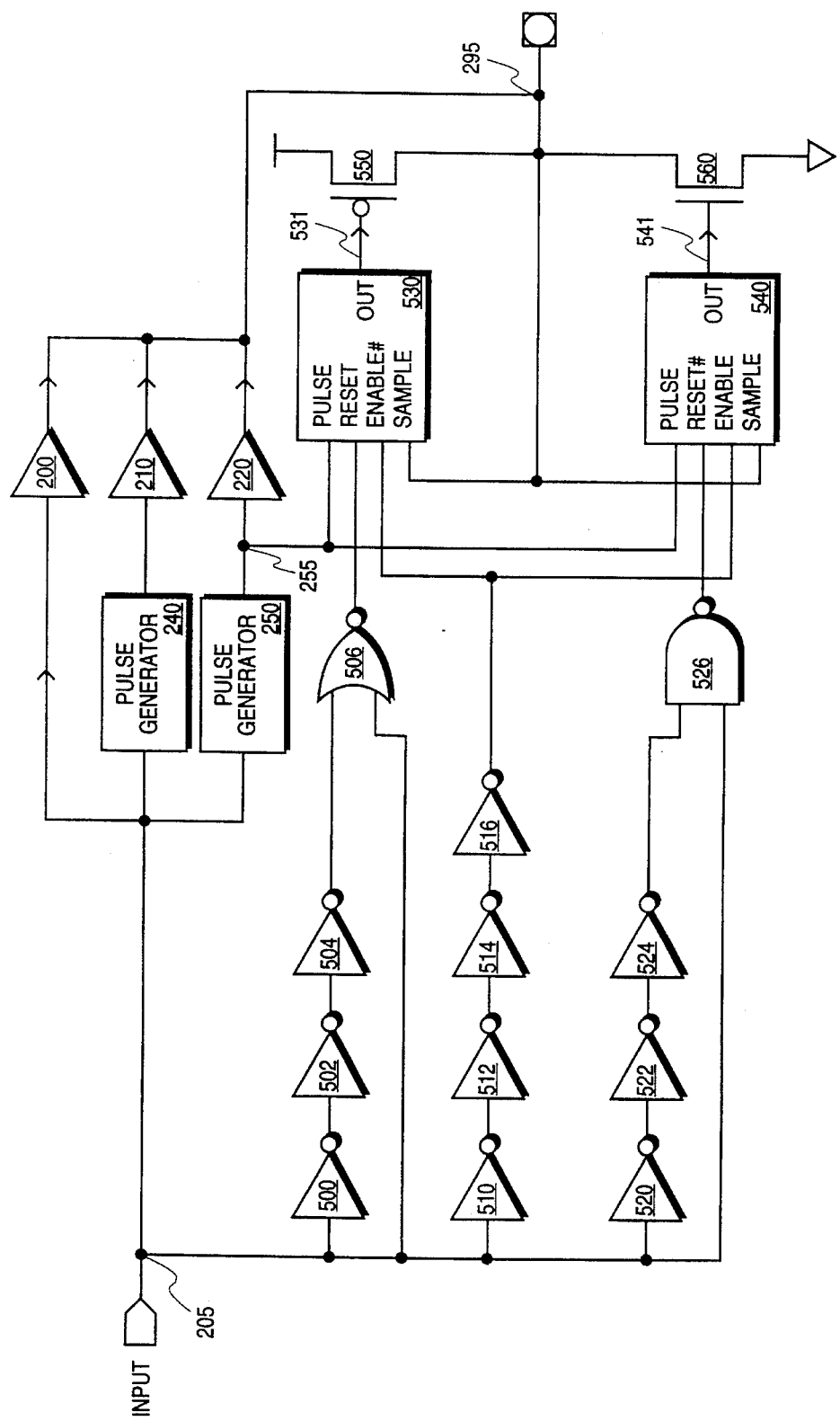
FIG. 5 is a diagram showing details of the reset and control block and the feedback circuit of FIG. 2.

Details of an embodiment of the reset and control circuit 260 and the feedback circuit 280 are shown in FIG. 5. According to the operation of the feedback circuit, driver transistors 550 and 560 drive output 295. Driver transistor 550 is a P transistor with a source connected to Vcc, a drain connected to output 295, and a gate connected to node 531. Driver transistor 550 is controlled by control circuit 530 which has an output coupled to node 531 and PULSE, RESET, ENABLE#, and SAMPLE inputs respectively coupled to node 255, NOR gate 506, inverter 516, and output 295. Driver transistor 560 is an N transistor with a source coupled to Vss, a drain coupled to output 295, and a gate coupled to node 541. Driver transistor 560 is controlled by control circuit 540 which has an output coupled to node 541 and PULSE, RESET#, ENABLE, and SAMPLE inputs respectively coupled to node 255, NAND gate 526, inverter 516, and output 295.

Controller 530 operates in response to an input transition from 1 to 0 on input 205. In response to the input transition, an active high reset pulse is applied to the RESET input of controller 530 by NOR gate 506 which has an input coupled directly to input 205 and another input coupled through inverters 500, 502, and 504 to input 205. Also responsive to the input transition, buffer 200 and pulsed buffers 21 0 and 220 begin driving an output transition, switching output 295 from 0 to 1. The ENABLE# input of controller 530 is coupled to input 205 through serially connected inverters 510, 512, 514, and 516, enabling the controller 530 in response to the 0 on input 205. The PULSE input of controller 530 is coupled to pulse generator 250 and controller 530 samples a reference voltage on the SAMPLE input responsive to a pulse received from pulse generator 250. Driver transistor 550 is actuated responsive to the difference between the reference value and subsequent values on output 295 received through the SAMPLE input of controller 530.

Operation of controller 530 may be more clearly understood considering the waveforms illustrated in FIG. 4B where the input transition is shown as waveform 205b and the output transition is shown as waveform 295b. Waveform 465 illustrates a second output voltage waveform which exhibits ringing. If the magnitude of ringing is unacceptably large, the embodiment of FIG. 5 may be used for compensation. At a time indicated by marker 475 which corresponds to a rising edge of waveform 331b, a reference voltage level of waveform 295b is sampled by controller 530. The reference voltage level, indicated by point 455, defines a lower limit shown by marker 485. Waveform 295b does not subsequently dip below the lower limit. On the other hand, waveform 465 does dip below the lower limit, resulting in a difference between the lower limit and the second output voltage waveform which causes controller 530 to drive node 531 low, enabling driver transistor 550.

Controller 540 of FIG. 5 operates in response to an input transition from 0 to 1 on input 205. In response to the input transition, an active low reset pulse is applied to the RESET# input of controller 540 by NAND gate 526 which has an input coupled directly to input 205 and another input coupled through inverters 520, 522, and 524 to input 205. Also responsive to the input transition, buffer 200 and pulsed buffers 210 and 220 begin driving an output transition, switching output 295 from 1 to 0. The ENABLE input of controller 540 is coupled to input 205 through serially connected inverters 510, 512, 514, and 516, enabling the controller 540 in response to the 1 on input 205. The PULSE input of controller 540 is coupled to pulse generator 250 and controller 540 samples a reference voltage on the SAMPLE input responsive to a pulse received from pulse generator 250. Driver 560 is actuated responsive to the difference between the reference value and subsequent values on output 295 received through the SAMPLE input of controller 540.

Figure 6:
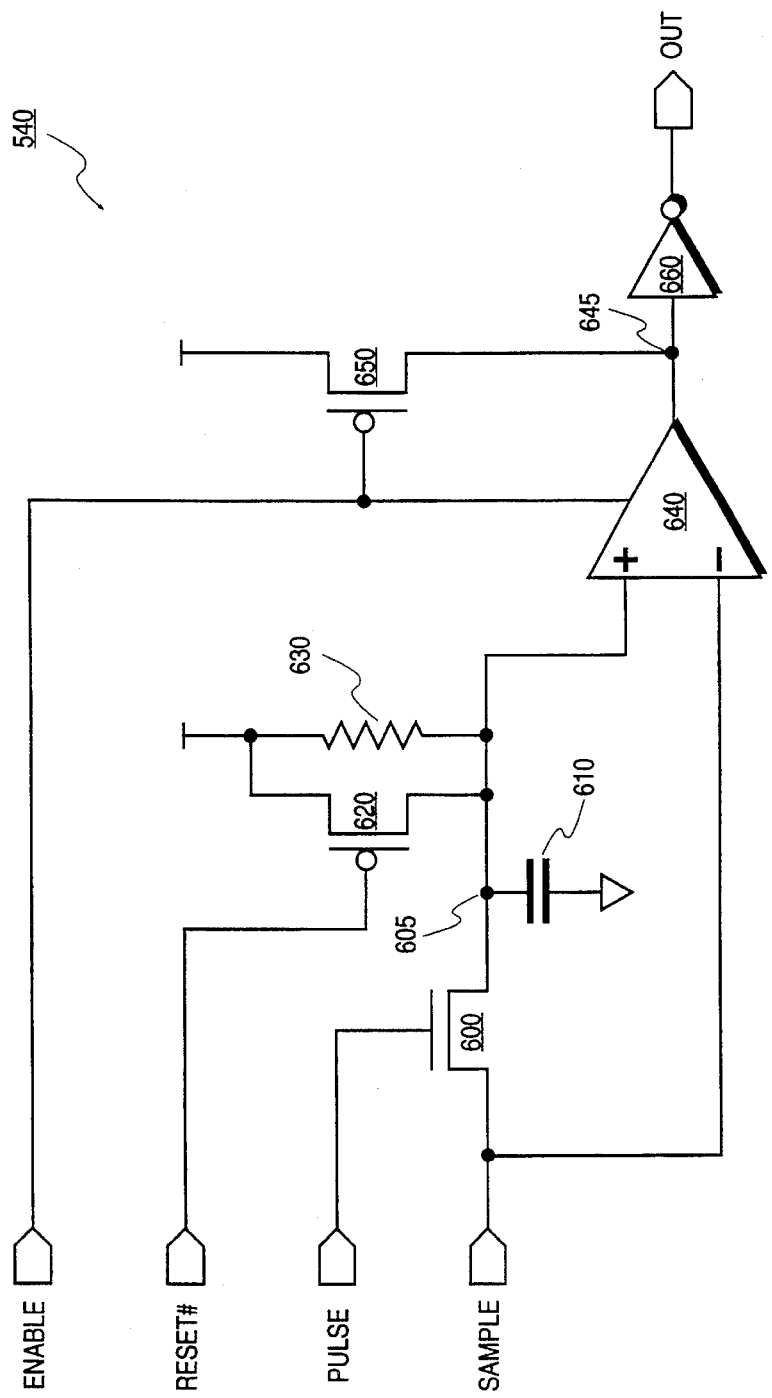
FIG. 6 is a schematic representation of a controller illustrated in FIG. 5.

Further details of an implementation of controller 540 are shown in FIG. 6. Sampling element 600 is an N transistor with an input coupled to the SAMPLE input, an output coupled to node 605, and a control coupled to the PULSE input. Storage element 610 is a capacitor which is coupled to node 605 and Vss. A reset device 620 is a P transistor with a source coupled to Vcc, a drain coupled to node 605, and a gate coupled to the RESET# input. A resistor 630 is coupled to Vcc and node 605. A differential amplifier 640 has an enable coupled to the ENABLE input, an output coupled to node 645, and positive and negative inputs coupled respectively to node 605 and the SAMPLE input. Pullup device 650 is a P transistor with a source coupled to Vcc, a drain coupled to node 645, and a gate coupled to the ENABLE input. An inverter 660 has an input coupled to node 645 and an output coupled to an OUT output of the controller 540.

Operation of the embodiment of controller 540 shown in FIG. 6 may be more clearly understood considering the waveforms illustrated in FIG. 4A where the input transition from 0 to 1 is shown as waveform 205a and the output transition is shown as waveform 295a. Waveform 460 illustrates a second output transition which exhibits ringing, and waveform 346a illustrates a pulse applied to the PULSE input. As previously discussed, NAND gate 526 illustrated in FIG. 6 applies an active low reset pulse (not shown) to the RESET# input in response to the input transition. This reset pulse turns on reset device 620, discharging capacitor 610. Sampling element 600 is turned on during the high time of waveform 346a, thus charging capacitor 610 to a voltage level of the SAMPLE input. Marker 470 indicates a time corresponding to a falling edge of waveform 346a at which sampling element is turned off. A sampled reference voltage level as indicated by point 450 defines an upper limit shown by marker 480. Waveform 295a does not subsequently rise above the upper limit. On the other hand, waveform 460 does rise above marker 485. At the point in time when waveform 460 rises above marker 485, the value on the SAMPLE input of FIG. 6 will be greater than the reference voltage level on node 605, resulting in differential amplifier 640 driving node 645 to a 0. This causes inverter 660 to drive output OUT to a 1, enabling a pulldown transistor such as driver transistor 560 shown in FIG. 5 to compensate for the ringing.

Resistor 630 makes controller 540 decreasingly sensitive to ringing as time elapses after the output transition. At a rate controlled by the resistor and capacitor values, resistor 630 charges the storage element 610 and thereby increases the reference voltage level. With an increasing reference voltage level, differential amplifier 640 will require a larger voltage level on the SAMPLE input to switch node 645, thus the controller is desensitized over time. Additionally, the controller will be more sensitive to ringing in slow conditions because the performance of resistor 630 tracks process and environmental conditions, and the increase in the reference voltage level stored (which controls the desensitization of controller 540) will occur more slowly under slow conditions. This means that the reference voltage level at a given time after the transition will be lower under slow conditions, resulting in the differential amplifier tripping with less ringing. Thus compensation is greater under slow conditions, and, conversely, the risk of overcompensation under fast conditions is reduced.

Figure 7:
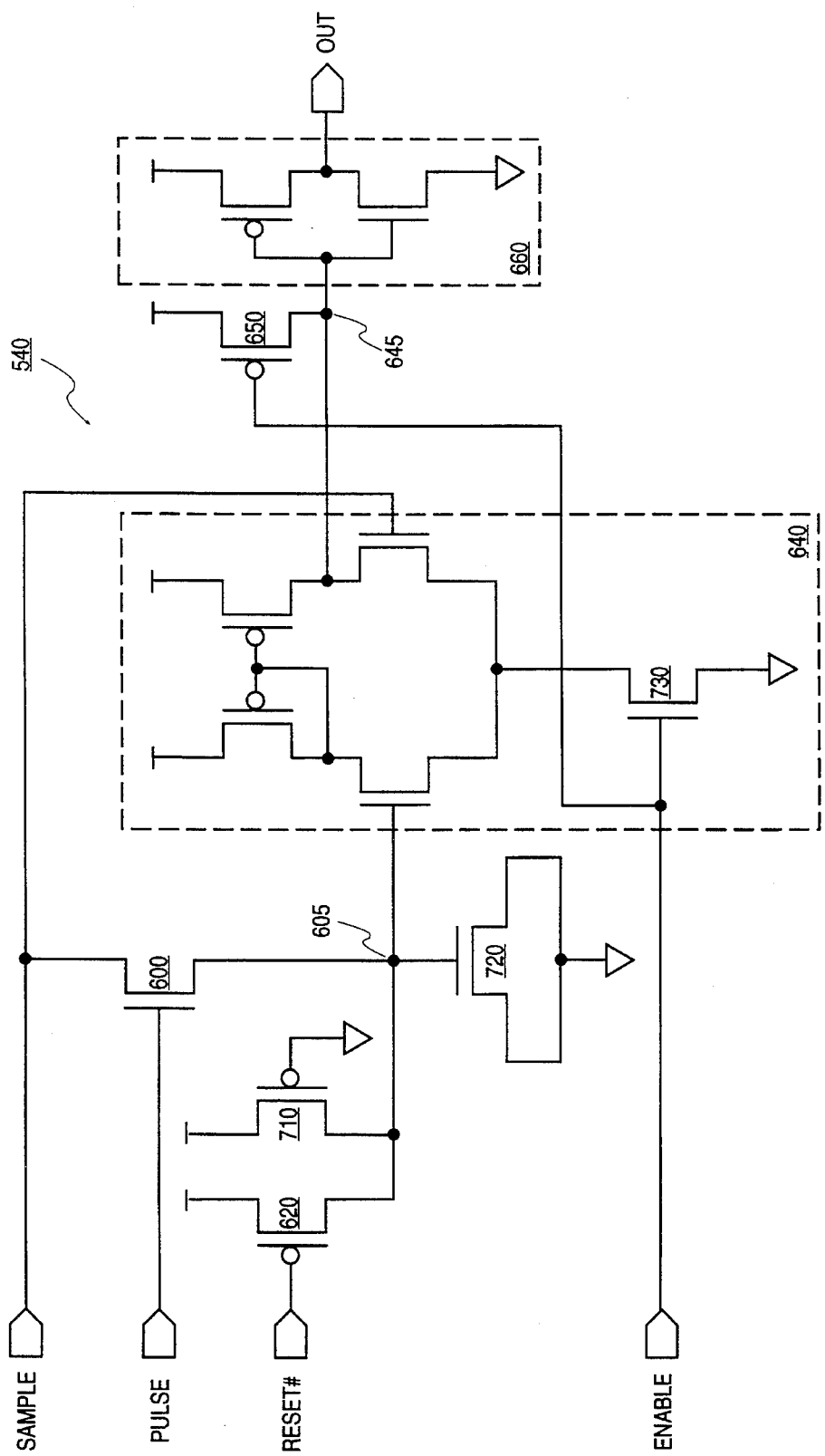
FIG. 7 is a transistor level schematic of the controller illustrated in FIG. 6.

The controller 540 of FIG. 6 may be implemented using P and N transistors in a CMOS process as shown in the schematic diagram of FIG. 7. A complementary circuit could be used for controller 530. A capacitor 720 formed using an N transistor with a source and drain coupled to Vss and a gate coupled to node 605 is used as the storage element 610 of FIG. 6. A P transistor 710 with a source coupled to Vcc, a drain coupled to node 605, and a gate coupled to Vss forms resistor 630 of FIG. 6. Inverter 660 is implemented using individual transistors as is differential amplifier 640. Since controller 540 is used during a 0 to 1 transition on input 205, transistor 730 of differential amplifier 640 allows the differential amplifier to be disabled when input 205 remains a 0 to reduce power consumption. The disabling of differential amplifier 640 with a 0 on the gate of transistor 730 not only causes differential amplifier 640 not to drive node 645 but also causes pullup device 650 to drive a 1 on node 645 causing inverter 660 to drive a 0 on OUT, resulting in the disabling of driver transistor 560. Thus the differential amplifier 640 of controller 540 and the driver transistor 560 controlled by controller 540 are disabled when a 0 from input 205 propagates to the ENABLE input of controller 540.

While certain exemplary embodiments of a pulse controlled impedance compensated buffer have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. In a buffer including a buffer input and a buffer output and providing a buffer output transition from a first level to a second level in response to a buffer input transition, an improvement comprising:

a first transient driver circuit coupled to the buffer output having a first driving signal responsive to the buffer input transition, the first driving signal being a first pulsed signal active for a first duration partially encompassing the output transition;

a second transient driver circuit coupled to the buffer output having a second driving signal responsive to the buffer input transition, the second driving signal being a second pulsed signal active for a second duration partially encompassing the output transition and different from the first duration.

2. The buffer of claim 1 wherein the first and the second duration overlap.

3. The buffer of claim 2 wherein the first driving signal is generated by a first pulse generator circuit which incorporates a first delay, and the second driving signal is generated by a second pulse generator circuit which incorporates a second delay.

4. The buffer of claim 3 further comprising:

a third driver circuit coupled to the buffer input and the buffer output, the third driver circuit being active throughout the buffer output transition;

a fourth driver circuit coupled to the buffer output; and a feedback circuit coupled to the buffer output, the feedback circuit enabling the fourth driver circuit if a signal level of the buffer output exceeds a reference value.

5. In a buffering device including a device input and a device output and providing a device output transition from a first level to a second level in response to a device input transition, an improvement comprising:

a first buffer coupled to the device input and the device output;

a feedback circuit coupled to the device input and coupled to the device output, the feedback circuit controlling the first buffer in response to a difference between an output signal level of the device and a reference signal level, the reference signal level being sampled from the device output during the device output transition.

6. The buffering device of claim 5 wherein the feedback circuit further comprises a sampling circuit coupled to the device output and a differential amplifier coupled to the sampling circuit and coupled to the device output, the sampling circuit sampling the reference signal level, and the differential amplifier activating the first buffer if the device output signal level after the sampling exceeds the reference signal level.

7. The buffering device of claim 5 wherein the feedback circuit further comprises a sampling circuit coupled to the device output and a differential amplifier coupled to the sampling circuit and coupled to the device output, the sampling circuit sampling the reference signal level, and the differential amplifier activating the first buffer if the device output signal level after the sampling is less than the reference signal level.

8. The buffering device of claim 6 wherein the sampling circuit comprises a capacitive storage element and the feedback circuit further includes a reset circuit which resets the capacitive storage element responsive to the device input transition.

9. The buffering device of claim 8 wherein the feedback circuit further comprises a resistive element coupled to the capacitive element and coupled to a power supply, the resistive element adjusting the reference signal level.

10. An integrated circuit including a buffering device having a device input and a device output and providing a device output transition from a first level to a second level in response to an device input transition, the buffering device comprising:

a first buffer coupled to the device input and the device output active throughout the device output transition;

a pulse generator circuit coupled to the device input;

a second buffer coupled to the device output and coupled to the pulse generator circuit, the pulse generator circuit controlling a duration partially encompassing the device output transition that the second buffer is enabled;

a feedback circuit coupled to the device output; and a third buffer coupled to the device output and coupled to the feedback circuit, the feedback circuit adjusting the operation of the third buffer in response to the device output.

11. The buffering device of claim 10 wherein the pulse generator circuit comprises a plurality of individual pulse generators and the second buffer comprises a plurality of individual driver circuits, each of the plurality of individual pulse generators coupled to at least one individual driver circuit, and each of the plurality of individual pulse generators controlling an individual duration the at least one individual driver circuit coupled thereto is enabled.

12. The buffering device of claim 10 wherein the pulse generator circuit includes a first and a second pulse generator, the second buffer includes a first and a second pulsed driver circuit, the first pulse generator controlling a first duration the first pulsed driver circuit is enabled, the first duration partially encompassing the device output transition, and the second pulse generator controlling a second duration the second pulsed driver circuit is enabled, the second duration partially encompassing the device output transition, the first and the second duration being different.

13. The buffering device of claim 12 wherein the first and second duration are overlapping.

14. The buffering device of claim 13 wherein the feedback circuit comprises:

a sampling element with a sampling input and a sampling output, the sampling input coupled to the device output;

a storage element coupled to the sampling output of the sampling element; and a differential amplifier including a first and second differential input and a differential output, the first differential input coupled to the device output, the second differential input coupled to the storage element, and the differential output controlling the third buffer.

15. The buffering device of claim 13 wherein the feedback circuit comprises:

a sampling element with a sampling control, a sampling input, and a sampling output, the sampling input coupled to the device output;

a storage element coupled to the sampling output of the sampling element;

a reset device coupled to a reset signal and the storage element, resetting the storage element when the reset signal is active;

a resistor coupled to the storage element and a power supply; and a differential amplifier including a first and second differential input and a differential output, the first differential input coupled to the device output, the second differential input coupled to the storage element, and the differential output controlling the third buffer.

16. The buffering device of claim 15 wherein the sampling control is coupled to the first pulse generator.

17. The buffering device of claim 16 wherein the reset signal is coupled to an edge detecting circuit which activates the reset signal in response to the device input transition.

18. The buffering device of claim 17 wherein the feedback circuit further comprises:

an enable signal coupled to the differential amplifier; and a pullup device which forces the differential output to an inactive state disabling the third buffer when the enable signal is deasserted.

19. The buffering device of claim 10 wherein the third buffer includes a pulldown transistor and a pullup transistor, and the feedback circuit comprises:

a first controller coupled to the device input, the device output, and the pulldown transistor, the first controller including a first sampling element storing a first value of the device output and a first differential amplifier comparing the first value and the device output and activating the pulldown transistor if the device output exceeds the first value;

a second controller coupled to the device input, the device output, and the pullup transistor, the second controller including a second sampling element for storing a second value of the device output and a second differential amplifier for comparing the second value and the device output and activating the pulldown transistor if the device output is less than the second value.

20. A buffer circuit with a buffer input, a buffer output, and an enable line, comprising:

an inverter with an inverter input coupled to the enable line and an inverter output coupled to an inverted enable line;

a first delay circuit with a first delay circuit input and a first delay circuit output, the first delay circuit input being coupled to the buffer input;

a second delay circuit with a second delay circuit input and a second delay circuit output, the second delay circuit input being coupled to the first delay circuit output;

a first OR gate with a first OR gate output and a plurality of first OR gate inputs, the plurality of first OR gate inputs coupled to the buffer input, the first delay circuit output, and the inverted enable line;

a second OR gate with a second OR gate output and a plurality of second OR gate inputs coupled to the buffer input, the second delay circuit output, and the inverted enable line;

a third OR gate with a third OR gate output and a plurality of third OR gate inputs coupled to the buffer input and the inverted enable line;

a first AND gate with a first AND gate output and a plurality of first AND gate inputs coupled to the enable line and the buffer input;

a second AND gate with a second AND gate output and a plurality of second AND gate inputs coupled to the enable line, the second delay circuit output, and the buffer input;

a third AND gate with a third AND gate output and a plurality of third AND gate inputs coupled to the enable line, the first delay circuit output, and the buffer input;

a first, second, and third pullup transistor respectively coupled to the first OR gate output, the second OR gate output, and the third OR gate output, each of the first, second, and third pullup transistors also coupled to a voltage supply and the buffer output; and a first, second, and third pulldown transistor respectively coupled to the first AND gate output, the second AND gate output, and the third AND gate output, each of the first, second, and third pulldown transistor also being coupled to a ground terminal and the buffer output.

21. The buffer circuit of claim 20 wherein the first delay circuit comprises an odd number of inverters and the second delay circuit comprises an even number of inverters.

22. In an integrated circuit, a buffering device including a device input and a device output and providing a device output transition in response to a device input transition, comprising:

a first pulse generator circuit coupled to the device input, the first pulse generator circuit having a first delay circuit with a first delay which decreases with faster operating conditions and increases with slower operating conditions, the first pulse generator circuit generating a first pulse of a first pulse width dependent on the first delay of the first delay circuit, the first pulse partially encompassing the device output transition;

a second pulse generator circuit coupled to the device input, the second pulse generator circuit having a second delay circuit with a second delay which decreases with faster operating conditions and increases with slower operating conditions, the second pulse generator circuit generating a second pulse of a second pulse width dependent on the second delay of the second delay circuit and partially encompassing the device output transition, the first pulse width being different than the second pulse width, and the first pulse overlapping the second pulse;

a first buffer circuit with a first drive strength coupled to the device input, the device output, and enabled by the first pulse generated by the first pulse generator circuit, the first drive strength increasing with faster operating conditions and the first drive strength decreasing with slower operating conditions;

a second buffer circuit with a second drive strength coupled to the device input, the device output, and enabled by the second pulse generated by the second pulse generator circuit, the second drive strength increasing with faster operating conditions and the second drive strength decreasing with slower operating conditions;

a third buffer circuit coupled to the device input and the device output, the third buffer circuit being active throughout the device output transition;

a fourth buffer circuit coupled to the device output; and a feedback circuit coupled to the device output and coupled to the first pulse generator circuit, the feedback circuit including a sampling element and a differential amplifier, the sampling element being coupled to the device output, coupled to a capacitive storage element, and coupled to the first pulse generator, the sampling element being enabled by the first pulse to sample a reference signal level, the differential amplifier being coupled to the device output and the capacitive storage element and enabling the fourth buffer circuit if a signal level of the device output exceeds the reference signal level.

23. An improved method for providing an output signal level which includes an output transition during an output transition period in response to an input transition, the improvement comprising the steps of:

a) generating a first pulsed signal having a first duration partially encompassing the output transition period;

b) generating a second pulsed signal having a second duration partially encompassing the output transition period, the second duration being different than the first duration; and c) using the first and second signal to enable a first and second transient driver during the output transition.

24. The method of claim 23 further comprising the steps of:

d) sampling a reference value of the output signal level;

e) generating a feedback signal responsive to excessive ringing of the output signal level as determined by a difference between the output signal level and the reference value; and f) using the feedback signal to control a third driver which compensates the output signal level.

25. An improved method for providing an output signal level which includes an output transition in an output transition period in response to an input transition, the improvement comprising the steps of:

a) sampling a reference value of the output signal level;

b) generating a feedback signal responsive to excessive ringing of the output signal level as determined by a difference between the output signal level and the reference value; and c) using the feedback signal to control a driver of the output signal level.

26. An improved buffering device for providing an output transition in response to an input transition, the improvement comprising:

first means for generating a first pulse in response to the input transition, the first pulse having a first duration;

second means for generating a second pulse in response to the input transition, the second pulse having a second duration being different from the first duration;

first transient driver means for driving the output transition during the first duration; and second transient driver means for driving the output transition during the second duration.

27. The buffering device of claim 26 further comprising:

means for generating a control signal responsive to a difference between a level of the output transition and a reference level; and third driver means for supplementing the first and second driver means responsive to the control signal.

28. An improved buffering device for providing an output signal level which includes an output transition in response to an input transition, the improvement comprising:

means for sampling, at a sampling time, a reference value of the output signal level;

means for generating a control signal responsive to the difference between the reference value and the output signal level; and means for driving the output signal level responsive to the control signal.

29. The buffering device of claim 28 further comprising:

first means for generating a first pulse in response to the input transition, the first pulse having a first duration and controlling the sampling time;

second means for generating a second pulse in response to the input transition, the second pulse having a second duration being different from the first duration;

first driver means for driving the output transition during the first duration; and second driver means for driving the output transition during the second duration.

\* \* \* \* \*

UNITED STATES PATENT AND TRADEMARK OFFICE
CERTIFICATE OF CORRECTION

PATENT NO. : 5,528,166
DATED : June 18, 1996
INVENTOR(S) : Ilkbahar

It is certified that error appears in the above-identified patent and that said Letters Patent is hereby corrected as shown below:

On the title page, in Section [19], delete "Iikbahar" and substitute --Ilkbahar--

On the title page, in Section [75] Inventor, delete "Iikbahar" and substitute --Ilkbahar--

In column 5, at line 14, delete "am" and substitute --are--

Signed and Sealed this

Twenty-ninth Day of October 1996

Attest:

BRUCE LEHMAN

*Attesting Officer*  *Commissioner of Patents and Trademarks*